United States Patent [19]
Wu

[11] Patent Number: 6,090,653
[45] Date of Patent: Jul. 18, 2000

[54] METHOD OF MANUFACTURING CMOS TRANSISTORS

[75] Inventor: Shye-Lin Wu, Hsinchu, Taiwan

[73] Assignees: Texas Instruments; Acer Incorporated, both of Hsinchu, Taiwan

[21] Appl. No.: 09/243,916

[22] Filed: Feb. 3, 1999

Related U.S. Application Data

[63] Continuation-in-part of application No. 09/050,541, Mar. 30, 1998, Pat. No. 5,956,584.
[51] Int. Cl.$^7$ .............................................. H01L 21/8238
[52] U.S. Cl. .......................... 438/231; 438/227; 438/232; 438/683; 438/685
[58] Field of Search .................................... 438/199, 221, 438/230, 231, 232, 233, 682, 683, 685

[56] References Cited

U.S. PATENT DOCUMENTS

| 5,656,519 | 8/1997 | Mogami | 438/305 |
|---|---|---|---|
| 5,759,885 | 6/1998 | Son | 438/199 |

*Primary Examiner*—Wael Fahmy
*Assistant Examiner*—Long Pham
*Attorney, Agent, or Firm*—Harness, Dickey & Pierce, P.L.C.

[57] ABSTRACT

The present invention includes forming gate structures having a nitride cap on the substrate. An ion implantation is used to dope ions into the substrate to form the lightly doped drain (LDD) structures. An oxide layer is formed on the gate structures. Subsequently, the oxide layer is etched back to form oxide spacers on the side walls of the gate structures. Next, an ion implantation with a tilted angle relative to the normal line of the substrate is used. The tilted angle is about 30 to 90 degrees respect to the substrate. The ions pass through the spacers, gate oxide and into the substrate under a portion of the gate by controlling the energy of the ion implantation. The spacers also doped with ions during the implantation. The energy of the ion implantation is about 5 to 150 KeV, and the dosage of the ion implantation is about 5E12 to 2E15 atoms/cm$^2$. The cap silicon nitride layer is then removed. Then, a refractory or noble metal layer is sputtered on the substrate, nitrogen doped oxide spacers and the gates. A first step thermal process is performed to form SALICIDE and polycide. Next, an ion implantation is utilized to dope ions into the SALICIDE and polycide films. A second step thermal process is employed to form a shallow source and drain junction.

21 Claims, 3 Drawing Sheets

METHOD OF MANUFACTURING CMOS TRANSISTORS

This is a continuation-in-part of U.S. patent application Ser. No. 09/050,541, filed Mar. 30, 1998 now U.S. Pat. No. 5,956,584.

FIELD OF THE INVENTION

The present invention relates to semiconductor devices, and more specifically, to complementary metal-oxide-semiconductor (CMOS) devices.

BACKGROUND

The semiconductor industry has advanced considerably in the field of Ultra Large Scale Integrated (ULSI) technologies. The fabrication of the metal-oxide-semiconductor transistor also follows this trend. As the size of the devices is scaled down, the fabrication of these transistors confronts more issues than ever in recent years. For example, high performance CMOS technology has been developed for achieving high packing density wafer for ultra large scale integrated (ULSI) circuits. The cost for the scaled devices is the parasitic effect which will degrade the RC delay and source and drain series resistance.

Hot carrier is another important issue to degrade the performance of the devices although the supply voltage is lowered to 2.5 V for 0.25 micron MOS. In order to provide reliable MOSFETs, many structures of the MOSFET have been proposed. The prior art has reported that an ion implantation with high dose nitrogen for doping into the polysilicon gate and silicon substrate will improve the performance of the deep sub-micron devices. For example, one approach of the prior art to improve the hot carrier resistance is the use of a NICE (nitrogen implantation into CMOS gate electrode and source and drain) structure. The NICE structure is proposed by T. Kuroi, et al., in IEDM Tech. Dig., p325, 1993, entitled "Novel NICE (Nitrogen Implantation into CMOS Gate Electrode and Source and Drain) Structure for High Reliability and High Performance 0.25 µm Dual Gate CMOS". In this structure, the surface channel PMOS with the p+ poly gate has been investigated in place of the buried channel with n+ poly gate due to the superior short channel behavior. This NICE structure exhibits nitrogen implanted n+ and p+ gates and nitrogen implanted p+ source and drain. The hot carrier problem will be effectively improved by incorporating nitrogen into the gate oxide with nitrogen implantation on the polysilicon gate.

However, the high dose (higher than $4E15$ atom/cm$^2$) nitrogen implantation will cause a drastic increase in sheet resistance of poly-Si gate, therefore the operation speed of devices will be degraded. Please refer to the article "Impact of Nitrogen Implantation on Highly Reliable Sub-Quarter-Micron Metal Oxide Field-Effect Transistors with Lightly Doped Drain Structure", S. Shimizu, et al., Jpn. J. Appel. Phys., vol. 35, p.802, 1996. The hot carrier degration in LDD n-MOS is caused by the generation of interface states or electron traps in the sidewall spacers. For the NICE structure, the nitrided gate oxide under the gate electrode is not effective in suppressing the generation of interface state electron traps. Thus, S. Shimizu proposed a NISW (nitrogen implantation in the silicon oxide sidewall spacers) structure to solve the aforesaid issue. The problem can be suppressed due to the dangling bonds and weakened bonds formed at the interface between the sidewall spacers and the silicon substrate are occupied by the segregated nitrogen atoms.

In order to increase operation speed, the self-aligned metal silicided process has developed for many years. The technology is used to achieve the purpose of reducing the resistance of the gate, the source and drain. The fast operation speed is a basic requirement for ultra-short channel MOSFET. M. T. Takagi, et al. provide a method of forming silicided process in IEDM, Tech. Dig., p.455, 1996. The self-aligned silicided contact technology is the popular method to reduce the resistance of the gate, drain and source electrode. For example, a metal layer, such as Ti, Pt, Co, W, Ni, Cr etc., is sputtered on the substrate, and the gate. Then, a rapid thermal annealing (RTA) at 350 to 700 degrees centigrade is performed to react the metal with the gate and the substrate. Then, a stripping step is used to remove the non-reactive metal on the side wall spacers of the gate. Therefore, the silicide layers are self-aligned formed on gate, source and drain regions.

Further, an article reported that the spacers having oxynitride can suppress the short channel effects or reverse short channel effect. Please refer to the article proposed by P. G. Y. Tsui, et al., in IEDM Tech. Dig., p.501, 1994, entitled "Suppression of MOSFET Reverse Short Channel Effect by $N_2O$ Gate Poly Reoxidation Process".

SUMMARY

The object of the present invention is to form a self-aligned silicide CMOS using oblique ion implantation to improve the reliability. The ion implantation with tilted angle forms extended doped portions under a portion of the gate to avoid punch-through effect.

In accordance with the present invention, an N-well and a P-well are created in a substrate using suitable processes. Subsequently, a thin oxide layer is formed on the substrate to act as a gate oxide. An undoped polysilicon layers is deposited by chemical vapor deposition on the gate oxide layer. Next, a silicon nitride layer is successively formed on the polysilicon layer to act as an anti-reflective coating (ARC). Then, the undoped polysilicon layer, ARC layer, and the oxide layer are patterned to form ultra short channel polysilicon gates on the P-well and N-well, respectively. An ion implantation is used to dope ions into the substrate to form the lightly doped drain (LDD) structures. An oxide layer is formed on the gate structures. Subsequently, the oxide layer is etched back to form oxide spacers on the side walls of the gate structures.

Next, an ion implantation with a tilted angle respective to the surface of the substrate is used. The tilted angle is about 10 to 60 degrees with respect to the normal line of the substrate. Thus, some of the ions will pass through the spacers, gate oxide and into the substrate under a portion of the gate by controlling the energy of the ion implantation. The spacers also doped with ions during the implantation. The nitrogen doped oxide spacers are used to suppress the reverse short channel effect or short channel effect. The extended doped portions 12a formed by the oblique ion implantation can suppress the p channel punch-through issue. The energy of the ion implantation is about 5 to 150 KeV, and the dosage of the ion implantation is about $5E12$ to $2E15$ atoms/cm$^2$.

A first step thermal process is performed at a lower temperature to react the metal with the polysilicon and the silicon to form silicide layers. Then, a stripping step is used to remove the non-reactive metal on the oxide spacers. Next, an ion implantation is utilized to dope ions into the silicide layers. A second step thermal process is employed to form the ultra-shallow source and drain junctions by using the silicide layers as the diffusion source. Preferably, the thermal process having high temperature is completed by using rapid thermal process.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

The present invention proposes a method to fabricate the CMOS transistors with a self-aligned silicide structure. One of the key steps is to implant ions into the substrate using ion implantation with tilted angle, thereby forming extended doped regions under a portion of the gate. The extended doped regions will suppress the punch-through effect. The tilted angle ion implantation is referred to an ion implantation that is performed with an angle relative to the normal line of the substrate. The detailed description can be seen as follows and in conjunction with the accompanying drawings.

Figure 1:
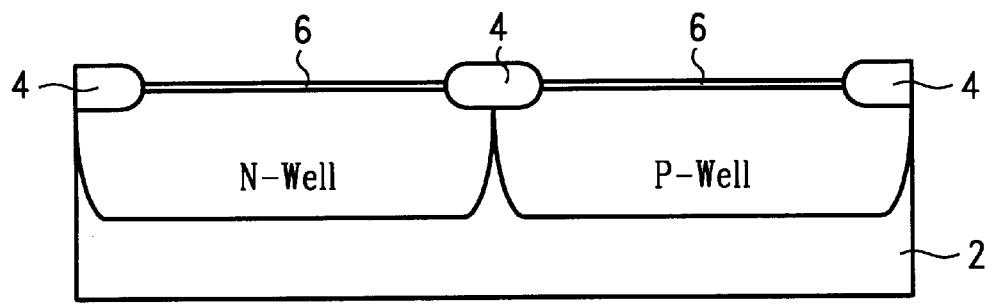
FIG. 1 is a cross-sectional view of a semiconductor substrate illustrating the step of forming a pad oxide layer on the semiconductor substrate according to the present invention.

Referring to FIG. 1, a single crystal substrate 2 with a <100> crystallographic orientation is used for the preferred embodiment. The substrate includes a plurality of field oxide regions 4 and twin well (P-well and N-well) previously formed therein. In this embodiment, thick field oxide (FOX) regions 4 are created for the purposes of isolation. Typically, the FOX regions 4 are created via a first photoresist and dry etching to define a silicon nitride-silicon dioxide composite layer. After the photoresist is removed and wet cleaned, thermal oxidation in an oxygen ambient is performed to form the FOX regions 4, to a thickness of about 3000–8000 angstroms. The silicon nitride layer is then typically removed using hot phosphoric acid solution while the silicon dioxide is removed by using diluted HF or BOE solution.

A thin oxide layer 6 is formed on the substrate 2 to act as a gate oxide. In the preferred embodiment, the gate oxide layer 6 is composed of silicon oxide that is formed by using an oxygen-steam ambient, at a temperature between about 800 to 1100 degrees centigrade. The gate oxide layer 6 can also be the silicon dioxide formed using a chemical vapor deposition process, with a tetraethylorthosilicate (TEOS) source, at a temperature between about 600 to 800 degrees centigrade and a pressure of about 0.1 to 10 torr. In the preferred embodiment, the thickness of the gate oxide layer 6 is about 15–200 angstroms.

Figure 2:
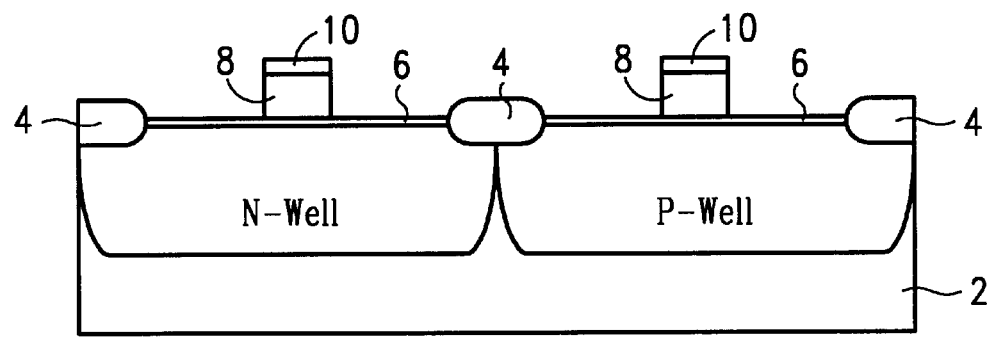
FIG. 2 is a cross-sectional view of a semiconductor substrate illustrating the step of forming gate structures on the semiconductor substrate according to the present invention.

Referring to FIG. 2, after the silicon oxide layer 6 is formed. An undoped polysilicon layer 8 is deposited by chemical vapor deposition on the gate oxide layer 6. Next, a silicon nitride layer 10 is successively formed on the polysilicon layer 8 to act as an anti-reflective coating (ARC). Then, the undoped polysilicon layer 8, ARC layer 10, and the oxide layer 6 are patterned to form ultra short channel polysilicon gate structures on the P-well and N-well, respectively.

Figure 3:
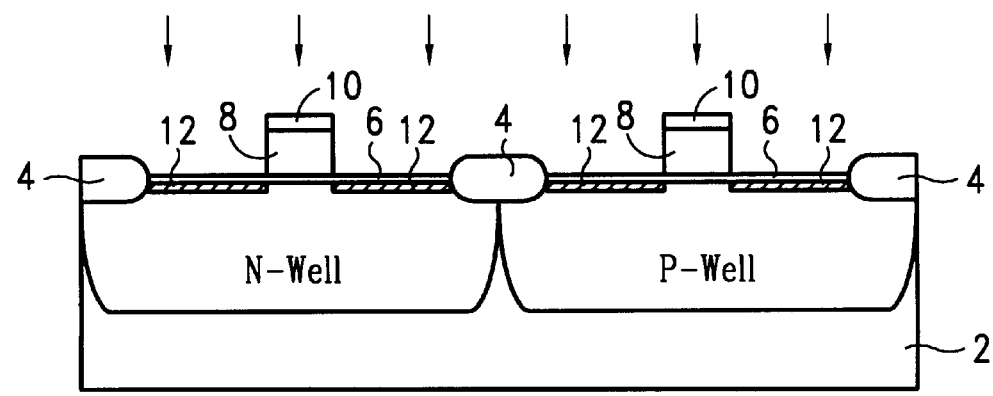
FIG. 3 is a cross-sectional view of a semiconductor substrate illustrating the step of performing an ion implantation according to the present invention.

Now referring to FIG. 3, an ion implantation is used to dope ions into the substrate such that the lightly doped drain (LDD) structures 12 are formed adjacent to the gate structures. Preferably, the dopant of the LDD implantation can be selected from the group of arsenic, phosphorus and the combination thereof for the nMOS devices, and boron or $BF_2$ and the combination thereof for the PMOS devices, respectively. The energy and dosage of the implantation are about 5 to 60 KeV, 5E12 to 1E14 atoms/cm$^2$, respectively.

Figure 4:
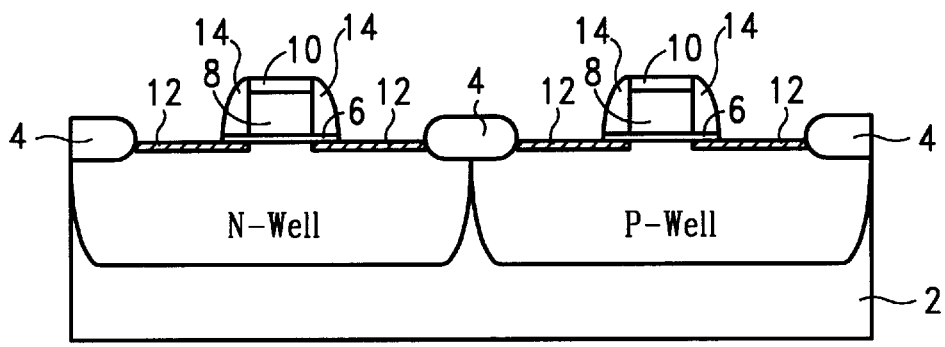
FIG. 4 is a cross-sectional view of a semiconductor substrate illustrating the step of forming oxide spacers on the semiconductor substrate according to the present invention.

As shown in FIG. 4, an oxide layer 14 is formed on the gate structures consisting of the gate 8 and the gate oxide 6. Subsequently, the oxide layer 14 is etched back by using anisotropical etching process. Thus, oxide spacers 14 are formed on the side walls of the gate structures.

Figure 5:
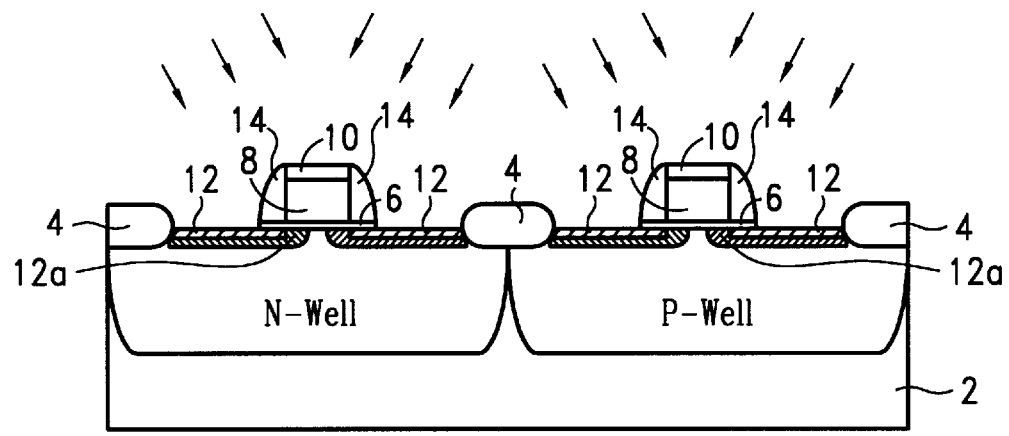
FIG. 5 is a cross-sectional view of a semiconductor substrate illustrating the step of performing a further ion implantation with tilted angle in the semiconductor substrate according to the present invention.

Next, an ion implantation with high dose is carried out to dope nitrogen ions into the oxide spacers 14, the cap silicon nitride 10 and the silicon substrate, as shown in FIG. 5. Preferably, the ion implantation is performed with a tilted angle respective to the surface of the substrate. The tilted angle is about 10 to 60 degrees with respect to the normal line of the substrate. Thus, some of the ions will pass through the spacers 14, gate oxide 6 and into the substrate under a portion of the gate 8 by controlling the energy of the ion implantation. In addition, other ions may stay in the spacers 14. The nitrogen doped oxide spacers 14 are used to suppress the reverse short channel effect or short channel effect. The doped regions (extended doped portions) under the poly gate 8 formed by the oblique ion implantation can suppress the p channel punch-through issue. Apparently, this structure will prevent boron ions from punching through. In a preferred embodiment, the energy of the ion implantation is about 5 to 150 KeV, and the dosage of the ion implantation is about 5E12 to 2E15 atoms/cm$^2$. Thus, the performance of the CMOS will be enhanced and the extended doped portions will improve the reliability of the devices.

Figure 6:
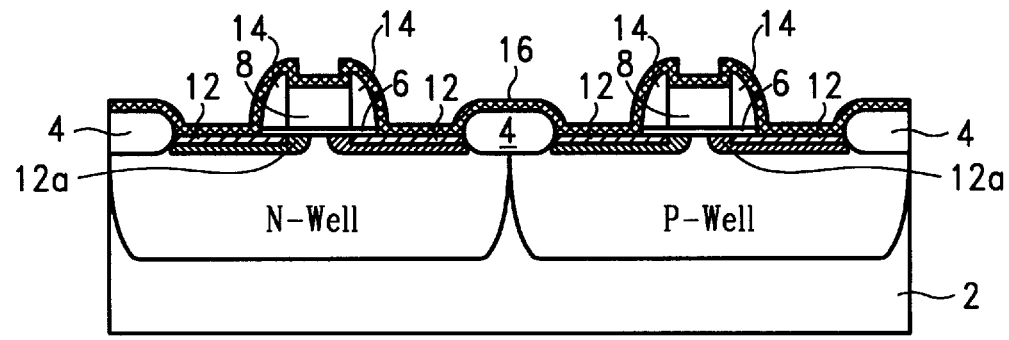
FIG. 6 is a cross-sectional view of a semiconductor substrate illustrating the step of forming a metal layer according to the present invention.

Turning to FIG. 6, the cap silicon nitride layer 10 is removed to expose the gates 8. This can be completed by means of hot phosphorus acid solution. Then, self-aligned silicide (SALICIDE) technique is introduced to reduce the resistance of the gate 8, and source and drain. First, a refractory or noble metal layer 16, such as Ti, Pt, Co, W, Ni, Pd, Cr etc., is sputtered on the substrate 2, nitrogen doped oxide spacers 14 and the gates 8.

Figure 7:
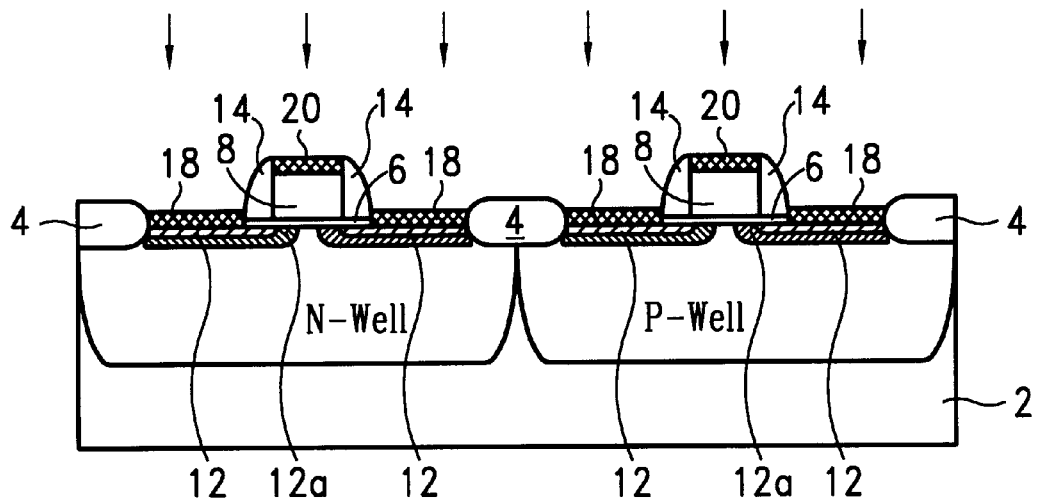
FIG. 7 is a cross-sectional view of a semiconductor substrate illustrating the steps of performing a silicide process and performing a source and drain implantation according to the present invention.

Referring to FIG. 7, a first step thermal process with lower temperature is performed at about 300 to 700 degrees centigrade in $N_2$ ambient to react the metal with the silicon and the polysilicon to form silicide layers on the gate, source and drain. Then, a strip step is used to remove non-reactive metal on the nitrogen doped oxide spacers 14. Therefore, the silicide 18 and the polycide 20 are self-aligned formed on the gates and the substrates, respectively. There is no bridge effect between the source and drain.

Next, an ion implantation is utilized to dope ions into the silicide 18 and the polycide 20 in order to make the source and drain regions for subsequent steps. The dopant of the ion implantation includes arsenic, phosphorus or the combination thereof for the nMOS devices, and boron, $BF_2$ or the combination thereof for the PMOS devices, respectively ions. In a preferably embodiment, the implantation is performed with an energy and dosage about 0.5 to 120 KeV and 5E14 to 5E16 atoms/cm$^2$, respectively.

Figure 8:
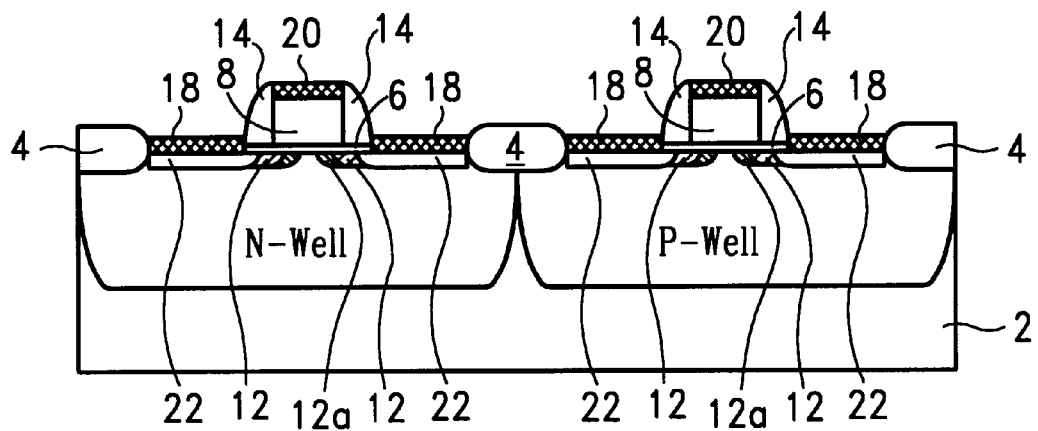
FIG. 8 is a cross sectional view of a semiconductor substrate illustrating the step of performing a thermal anneal to form a shallow junction according to the present invention.

FIG. 8 discloses the next step of the method of the present invention. With respect thereto, a second step thermal process for silicidation anneal is employed in $N_2$ ambient to form shallow source and drain junctions 22 adjacent to the LDD 12. Preferably, the thermal process is completed by using rapid thermal process with relatively high temperature compared to the first step thermal process. The temperature of this step is about 750 to 1150 degrees centigrade. The silicide 18, and polycide 20 films are used as a diffusion source for forming the shallow source and drain junction 22.

As can be appreciated from the above disclosure, the present invention provides the following advantages: (1) Device operation speed can be improved by using the self-aligned silicide technology. (2) Short channel effect or reverse channel effect will be suppressed by the nitride doped oxide spacers. (3) The sheet resistance of the gate can be sustained by using the cap nitride layer as a hard mask or barrier for nitrogen implant. (4) The extended doped portions under the gate generated by tilted ion implantation can eliminate the punch-through effect, which will improve the reliability of the devices.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structures. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing a CMOS device on a semiconductor substrate, the method comprising:

forming a gate oxide layer on said semiconductor substrate;

forming an undoped polysilicon layer on said gate oxide layer;

forming a silicon nitride layer on said undoped polysilicon layer to act as an anti-reflective layer;

patterning said silicon nitride layer, said undoped polysilicon layer and said first oxide layer to form gate structures on said semiconductor substrate;

performing a first ion implantation to form relatively light doped drain structures adjacent to said gate structures;

forming oxide spacers on side walls of said gate structures;

performing a second ion implantation with a tilted angle with respect to a normal line of said semiconductor substrate to dope nitrogen into said semiconductor substrate, said oxide spacers and said silicon nitride layer, and to form extended doped regions under a portion of said gate;

removing said silicon nitride layer;

forming a metal layer on said semiconductor substrate, said oxide spacers and said silicon nitride layer;

performing a first thermal process to react said metal layer with said semiconductor substrate and said gates;

removing non-reactive portion of said metal layer, thereby forming a self-aligned silicide (SALICIDE) on said semiconductor substrate and a polycide on said gate structures;

performing a third ion implantation to dope dopants into said SALICIDE and said polycide; and performing a second thermal process to form source and drain junction by diffusing dopants in said SALICIDE.

2. The method of claim 1, wherein said first thermal process is performed at a temperature about 300 to 700 degrees centigrade.

3. The method of claim 1, wherein said first thermal process is performed in an ambient containing nitrogen.

4. The method of claim 1, wherein said second thermal process is performed at a temperature about 750 to 1150 degrees centigrade.

5. The method of claim 1, wherein said second thermal process is performed in an ambient containing nitrogen.

6. The method of claim 1, wherein said tilted angle of said second ion implantation is about 10 to 60 degree.

7. The method of claim 1, wherein an energy of said second ion implantation is about 5 to 150 KeV.

8. The method of claim 1, wherein a dosage of said second ion implantation is about 5E12 to 2E15 atoms/cm$^2$.

9. The method of claim 1, wherein an energy of said third ion implantation is about 0.5 to 120 KeV.

10. The method of claim 1, wherein a dosage of said third ion implantation is about 5E14 to 5E16 atoms/cm$^2$.

11. The method of claim 1, wherein said silicon nitride layer is removed by using hot phosphorus acid solution.

12. The method of claim 1, further comprising following steps to form said oxide spacers:

forming an oxide layer on said semiconductor substrate and said gate structures; and anisotropically etching said oxide layer.

13. The method of claim 1, wherein said metal layer is selected from a group consisting of Ti, Pt, Co, W, Ni, Pd and Cr.

14. A method for manufacturing a CMOS device on a semiconductor substrate having an N-well and a P-well formed therein, the method comprising:

forming a gate oxide layer on said semiconductor substrate;

forming an undoped polysilicon layer on said gate oxide layer;

forming a silicon nitride layer on said undoped polysilicon layer to act as an anti-reflective layer;

patterning said silicon nitride layer, said undoped polysilicon layer and said first oxide layer to form gate structures on said semiconductor substrate;

performing a first ion implantation to form relatively light doped drain structures adjacent to said gate structures;

forming oxide spacers on side walls of said gate structures;

performing a second ion implantation with a tilted angle with respect to a normal line of said semiconductor substrate to dope nitrogen into said semiconductor substrate, said oxide spacers and said silicon nitride layer, and to form extended doped regions under a portion of said gate;

removing said silicon nitride layer;

forming a metal layer on said semiconductor substrate, said oxide spacers and said silicon nitride layer;

performing a first thermal process at a first temperature to react said metal layer with said semiconductor substrate and said gates;

removing non-reactive portion of said metal layer, thereby forming a self-aligned silicide (SALICIDE) on said semiconductor substrate and a polycide on said gate structures;

performing a second ion implantation to dope dopants into said SALICIDE and said polycide; and performing a second thermal process at a second temperature to form source and drain junction by diffusing dopants in said SALICIDE, wherein said second temperature is higher than said first temperature.

15. The method of claim 14, wherein said first thermal process is performed at a temperature about 300 to 700 degrees centigrade.

16. The method of claim 14, wherein said second thermal process is performed at a temperature about 750 to 1150 degrees centigrade.

17. The method of claim 14, wherein an energy of said second ion implantation is about 5 to 150 KeV.

18. The method of claim 14, wherein a dosage of said second ion implantation is about 5E12 to 2E15 atoms/cm$^2$.

19. The method of claim 14, wherein said tilted angle of said second ion implantation is about 10 to 60 degree.

20. The method of claim 14, wherein an energy of said third ion implantation is about 0.5 to 120 KeV.

21. The method of claim 14, wherein a dosage of said third ion implantation is about 5E14 to 5E16 atoms/cm$^2$.

* * * * *